United States Patent [19]
Takahashi et al.

[11] Patent Number: 4,900,695
[45] Date of Patent: Feb. 13, 1990

[54] SEMICONDUCTOR INTEGRATED CIRCUIT DEVICE AND PROCESS FOR PRODUCING THE SAME

[75] Inventors: Takahiko Takahashi, Tokyo; Funikazu Itoh, Fujisawa; Akira Shimase, Yokohama; HIroshi Yamaguchi, Fujisawa; Mikio Hongo; Satoshi Haraichi, both of Yokohama, all of Japan

[73] Assignee: Hitachi, Ltd., Tokyo, Japan

[21] Appl. No.: 134,460

[22] Filed: Dec. 17, 1987

[30] Foreign Application Priority Data

Dec. 17, 1986 [JP] Japan ................. 61-298731
Dec. 22, 1986 [JP] Japan ................. 61-303719

[51] Int. Cl.$^4$ .................. H01L 21/441; H01L 21/469
[52] U.S. Cl. ............................ 437/195; 437/189; 437/192; 357/71
[58] Field of Search ............. 437/189, 190, 192, 194, 437/195, 197, 198, 203, 288; 148/20, 25, 26, 50, 51, 90, 94, 93; 357/71, 67

[56] References Cited

U.S. PATENT DOCUMENTS

| | | | |
|---|---|---|---|
| 4,630,357 | 12/1986 | Rogers et al. | 438/195 |
| 4,675,979 | 6/1987 | Lade et al. | 437/195 |
| 4,675,980 | 6/1987 | Lade et al. | 437/195 |

FOREIGN PATENT DOCUMENTS 0062751 5/1980 Japan ................. 437/195

*Primary Examiner*—Rolf Hille
*Assistant Examiner*—S. V. Clark
*Attorney, Agent, or Firm*—Antonelli, Terry & Wands

[57] ABSTRACT

The present invention relates to a semiconductor integrated circuit device and a process for producing the same. A hole is bored in an insulating film above a portion of a wiring which is to be connected to another wiring by means of a focused ion beam. The inside of the hole and a predetermined region on the insulating film are irradiated with either a laser beam or an ion beam in a metal compound gas to deposit metal in the hole and on said region and a connecting wiring is formed by means of optically pumped CVD. To electrically connect upper- and lower-level wirings in a multilayer wiring structure by a connecting wiring, the connecting wiring is electrically isolated from an intermediate-level wiring through which it extends. The above-described arrangement enables provision of a hole with a focused ion beam and formation of a metal wiring on a selective region by means, for example, optically pumped CVD. Accordingly, it is possible to effect fine machining and electrically connect together wirings inside an LSI after the completion thereof. It is therefore possible to carry out debugging, repair and a defect analysis of the LSI.

31 Claims, 12 Drawing Sheets

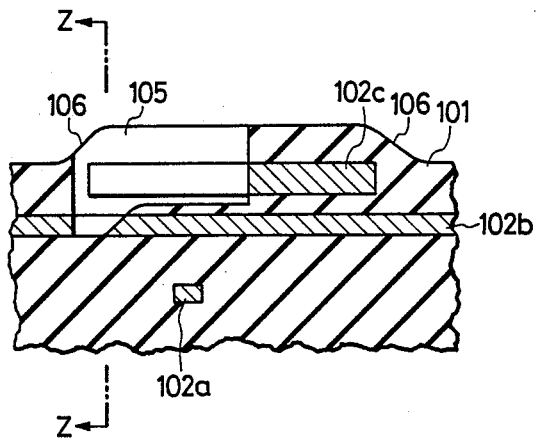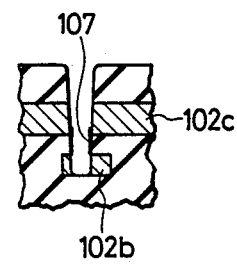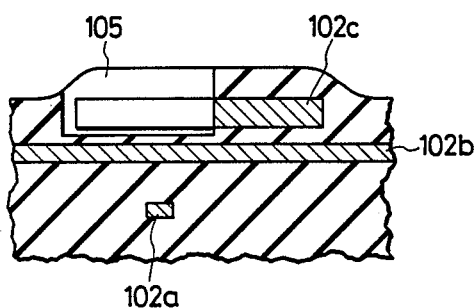

SEMICONDUCTOR INTEGRATED CIRCUIT DEVICE AND PROCESS FOR PRODUCING THE SAME

BACKGROUND OF THE INVENTION

The present invention relates to a semiconductor integrated circuit device and a process for producing the same. More particularly, the present invention pertains to a technique which may be effectively applied to a semiconductor integrated circuit device having a multilayer wiring structure and a process for producing such a semiconductor integrated circuit device.

Recently, it has been increasingly important to develop an effective technique of repairing a defective part in an LSI (Large Scale Integrated Circuit) or changing a logical design thereof by disconnecting and properly reconnecting part of the wirings within the LSI circuit after the completion of the LSI which is still in the form of a wafer or chip.

To attain the above-described object, the present applicant proposed in Japanese Patent Application No. 70979/1986 a method of connecting wirings in an LSI by a combination of an ion beam technique and a laser CVD technique. According to the proposed method, after the completion of an LSI having, for example, a double-layer wiring structure, wirings in a first-level layer are interconnected for the purpose, for example, of repairing a defective part or changing a logical design. In this case, since the wiring in the uppermost layer is generally widely laid out in order to supply a power supply current, it is necessary to provide contact holes extending through the wiring in the uppermost-level layer so as to reach the wirings in the lower-level layers and also provide a connecting wiring through the contact holes. For this arrangement, an insulating film on the uppermost-level wiring layer, the second-level wiring layer and an intermediate insulating film between the second-level wiring layer and the first-level wiring layer are processed by irradiation with a focused ion beam to form contact holes, thereby partially exposing the surfaces of the wirings in the first-level layer through the contact holes. After an insulating film, e.g., a silicon dioxide (SiO₂) film, has been formed on the whole surface of the chip, this insulating film is patterned by the use of photolithography and etching techniques so that the insulating film is left only in the vicinities of the contact holes. Then, the insulating film on the bottoms of the contact holes are removed by selective etching so that the surfaces of the wirings in the first-level layer are partially exposed through the contact holes again. Then, a metal is selectively deposited by laser CVD to thereby form a connecting wiring which interconnects the wirings in the first-level layer through the contact holes. In this case, since the connecting wiring is insulated from the wiring in the second-level layer by the insulating films formed within the contact holes, the wirings in the first- and second-level layers are prevented from shorting to each other.

On the other hand, as the result of increases in the degree of integration and miniaturization of ICs, it has recently been increasingly important to conduct an operation in which a defective part of an LSI is debugged or repaired in the step of developing the same by disconnecting and properly reconnecting part of the wirings within the LSI chip, thereby detecting errors in design or process, carrying out a defect analysis and returning the LSI to the process conditions, and thus increasing the production yield. For this purpose, examples in which the wirings in ICs are disconnected by means of a laser or ion beam have heretofore been reported.

More specifically, as a first prior art, "Laser Stripe Cutting System for IC Debugging" (Tech Digest of CLEO' 81, 1981, p.160) is known. In this prior art, an example in which wirings are disconnected by means of a laser to debug a defective part is reported. As a second prior art, Japanese Patent Application No. 42126/1983 is known. This prior art discloses a technique in which an ion beam generated from a liquid metal ion source is focused in the shape of a spot having a diameter of 0.5 μm or less to disconnect wirings and bore holes and a metal is deposited in the holes by an ion beam to thereby interconnect the upper and lower wirings.

As a third prior art, "Direct Wirting of Highly Conductive Mo Lines by Laser Induced CVD" (Extended Abstruct of 17th Conf. on Solid State Devices and Material, 1985, p.193) is known.

SUMMARY OF THE INVENTION

The above-described prior arts suffer, however, from the following problems.

The technique proposed in Japanese Patent Application No. 70979/1986 has the problems that photolithography and etching steps are needed to form an insulating film only in the vicinities of contact holes and that the process for preventing shorting between the wirings in the first- and second-level layers is complicated.

In the first prior art, a means for disconnecting wirings alone is shown but no means for reconnecting the wirings is shown. Further, employment of a laser machining method involves the following disadvantages:

(1) Since the machining process is thermally executed, conduction of heat to the surroundings is unavoidable, and since processes such as evaporation and blowoff of vapors take place, it is extremely difficult to conduct a fine machining operation on the order of 0.5 μm or less.

(2) Laser light is only slightly absorbed by insulating films such as SiO₂, Si₃N₄ or the like and it is therefore absorbed by an aluminum or polysilicon wiring in the underlayer, and when such a wiring evaporates and blows off, it explosively blows the upper insulating film away, thereby effecting machining of the insulating film. For this reason, when the thickness of the insulating layer is 2 μm or more, it is difficult to machine the insulating film. Further, the peripheral portions (the surroundings and the upper and lower layers) are greatly damaged, and this leads to generation of defects. These results show that it is difficult to machine wirings in ICs having a multilayer wiring structure or a high degree of integration and miniaturization by the laser machining method.

The second prior art discloses (3) a means for disconnecting and boring by a focused ion beam, and (4) a means for interconnecting the upper and lower wirings by the use of a focused ion beam. Since employment of a focused ion beam enables machining on the order of 0.5 μm or less and permits any materials to be successively machined from the upper layer with ease by means of sputtering, the second prior art overcomes the problems of the first prior art. However, as to the means for interconnecting the upper and lower wirings mentioned in (4), the second prior art shows only the procedure of interconnection of the upper and lower wirings but does not mention any means for providing connection between one wiring and another wiring.

The third prior art discloses a method wherein the surface of a silicon (Si) substrate coated with $SiO_2$ is irradiated with an ultraviolet laser in a gas of a metal organic compound, e.g., molybdenum carbonyl [Mo(CO)$_6$] to decompose Mo(CO)$_6$ by a photothermal or photochemical laser induced CVD process, thereby depositing a metal, e.g., molybdenum (Mo) on the substrate and thus lithographically forming a metal wiring directly on the substrate. However, this prior art discloses merely a means for forming a Mo wiring on an insulating film but shows no means for interconnecting wirings which are located under an insulating film such as a protective film or an intermediate insulating film in an actual IC without any fear of these wirings shorting to a wiring disposed in an upper-level layer.

Accordingly, it is an object of the present invention to provide a semiconductor integrated circuit device which is so designed that it is possible to form a connecting wiring without causing shorting between wirings respectively located in lower- and upper-level layers in a multilayer wiring structure.

It is another object of the present invention to provide a process for producing a semiconductor integrated circuit device which enables formation of a simple connecting wiring for interconnecting wirings respectively located in lower- and upper-level layers in a multilayer wiring structure.

It is still another object of the present invention to provide an IC which is so designed that it is possible to form fine holes in an insulating film such as a protective film or an intermediate insulating film in the IC, thereby enabling a wiring located under an insulating film such as a protective film or an intermediate insulating film to be connected to another portion through a connecting wiring and thus permitting the IC to be subjected to debugging, repair, a defect analysis, etc., and also provide a method of interconnecting wirings in the IC.

The above and other objects and novel features of the present invention will become clear from the following description of the preferred embodiments thereof taken in conjunction with the accompanying drawings.

BRIEF DESCRIPTION OF THE DRAWINGS

FIG. 23 is a sectional view taken along the line Y—Y of FIG. 16;

FIG. 24 is a sectional view taken along the line Z—Z of FIG. 23;

FIG. 28 is a sectional view taken along the line Y—Y of FIG. 16, which shows experimental results of the example shown in FIGS. 25 to 27.

DESCRIPTION OF THE PREFERRED EMBODIMENTS

Embodiment 1

Figure 1:
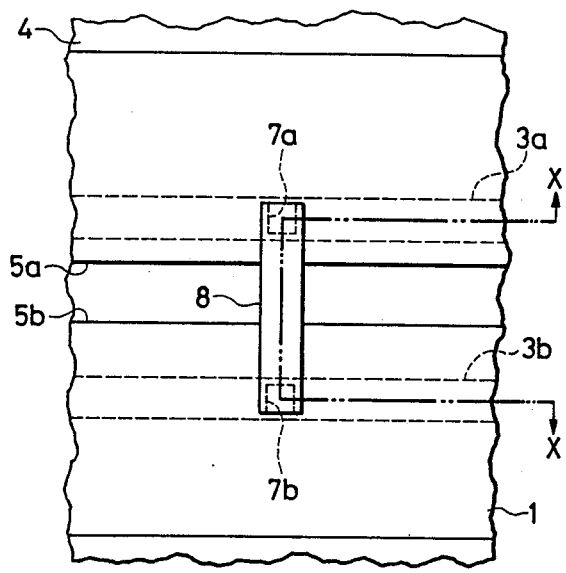
FIG. 1 is a plan view of an LSI having a double-layer wiring structure in accordance with one embodiment of the present invention.

One embodiment of the present invention will be described hereinunder specifically with reference to the accompanying drawings.

It should be noted that, throughout the drawings for describing this embodiment, members or portions having the same functions are denoted by the same reference numerals and repetitive description thereof is omitted.

Figure 2:
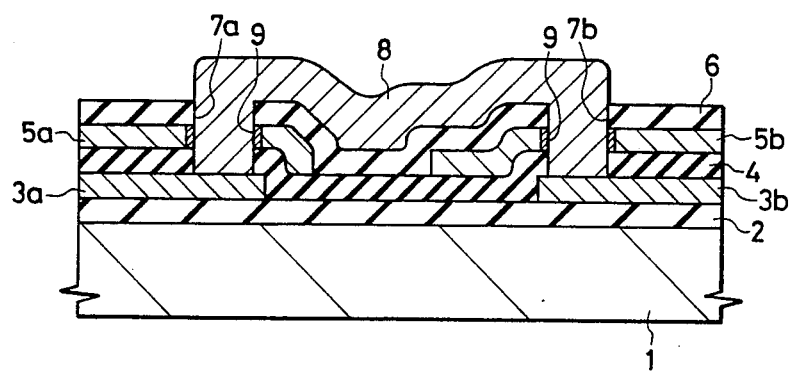
FIG. 2 is an enlarged sectional view taken along the line X—X of FIG. 1.

FIG. 1 is a plan view of an LSI having a double-layer wiring structure in accordance with one embodiment of the present invention, and FIG. 2 is an enlarged sectional view taken along the line X—X of FIG. 1.

As shown in FIGS. 1 and 2, the LSI in accordance with this embodiment has a semiconductor substrate (wafer) 1, for example, a silicon substrate, having a plurality of semiconductor elements such as transistors (not shown) fabricated thereon so as to form a semiconductor integrated circuit. An intermediate insulating film 2, for example, an $SiO_2$ film, is formed on the surface of the semiconductor substrate 1, and first-level wirings (i.e., lower-level wirings) 3a and 3b which are defined by, for example, an aluminum (Al) film, are provided on the intermediate insulating film 2. Another intermediate insulating film 4 which is defined by, for example, an $SiO_2$ film, is provided on the wirings 3a and 3b, and second-level wirings (i.e., upper-level wirings) 5a and 5b which are defined by, for example, an aluminum (Al) film, are provided on the intermediate insulating film 4. The wirings 5a and 5b define, for example, power supply wirings for supplying a power supply current, and are widely laid out over the surface of the intermediate insulating film 4. An insulating film 6 (not shown in FIG. 1) is further provided on the wirings 5a and 5b. Contact holes 7a and 7b are provided in such a manner as to extend through the insulating film 6, the wirings 5a, 5b (respectively) and the intermediate insulating film 4, and a connecting wiring 8 which interconnects the lower-level wirings 3a and 3b is provided in such a manner as to extend through these contact holes 7a and 7b. By using this connecting wiring 8, for example, a defect which is found after the completion of the LSI is repaired (or a logical design is changed). It should be noted that the contact holes 7a and 7b may be either vertical or tapered contact holes. The connecting wiring 8 is defined by a metal film such as a tungsten (W), molybdenum (Mo), cadmium (Cd) or aluminum (Al) film which is selectively formed by, for example, laser CVD.

The surfaces of the second-level wirings 5a and 5b which are exposed through the respective contact holes 7a and 7b are provided with respective insulating films 9, for example, alumina ($Al_2O_3$) films, which are formed by changing these surfaces into an insulator, thereby preventing contact between the connecting wiring 8 and the second-level wirings 5a, 5b. Accordingly, it is possible to form the connecting wiring 8 without any fear of the first-level wirings 3a, 3b electrically conducting, or shorting, to the second-level wirings 5a, 5b. The thickness of the insulating films 9 is selected so as to be adequate to obtain a necessary dielectric breakdown strength in accordance with the potential difference between the first-level wirings 3a, 3b and the second-level wirings 5a, 5b. For example, if the insulating films 9 are made of alumina (dielectric strength: about 500 V/$\mu$m) and the above-described potential difference is 5 V, the thickness of the films 9 may be selected so as to fall in the range from 1000 to 5000 Å.

The following is a description of a process for producing the LSI in accordance with this embodiment which is arranged as described above.

Figure 3:
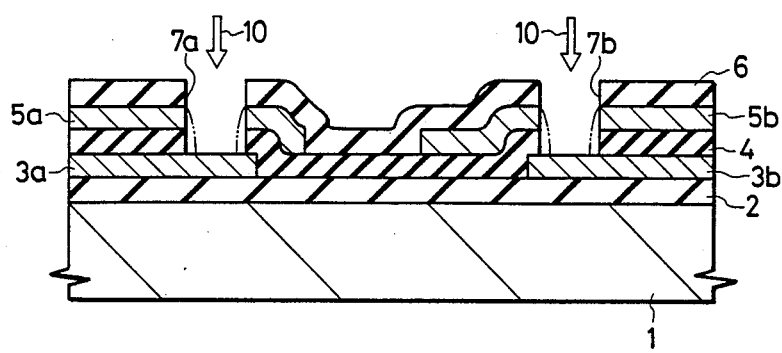
FIGS. 3 to 5 are sectional views showing successive steps in the process for producing the LSI shown in FIGS. 1 and 2.
Figure 6:
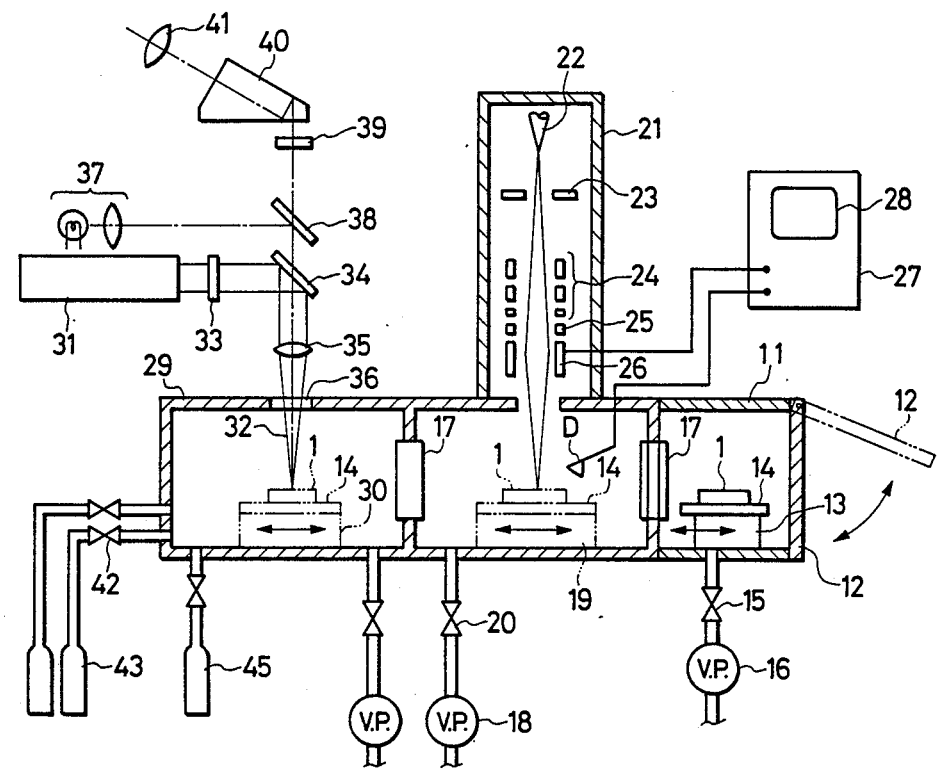
FIG. 6 shows an ion beam machining apparatus and a laser CVD apparatus.

Referring now to FIG. 3, a semiconductor integrated circuit is first formed on a silicon wafer 1 which serves as a starting material by carrying out diffusion of impurity ions, thermal oxidation of the silicon wafer 1, formation of thin films by CVD, formation of various patterns by the use of photolithographic techniques, etc. Then, an intermediate insulating film 2, first-level wirings 3a, 3b, an intermediate insulating film 4, second-level wirings 5a, 5b and an insulating film 6 are formed to complete an LSI. When it is necessary to find a possible defective part of the wirings and repair it, contact holes 7a and 7b are formed (see FIG. 3) by irradiating predetermined portions of the surface of the insulating film 6 with a focused ion beam 10 having a high degree of machining accuracy by using, for example, an ion beam machining apparatus such as that shown in FIG. 6 which is proposed in the aforementioned Japanese Patent Application No. 70979/1986. The ion beam machining method will next be explained in detail. Referring to FIG. 6, a lid 12 of a preliminary evacuation chamber 11 which defines a sample replacing chamber is first opened, and the above-described semiconductor wafer 1 is placed on a mount 14 which is installed on a stage 13. Then, the lid 12 is closed, and a valve 15 is opened to evacuate the preliminary evacuation chamber 11 by means of a vacuum pump 16. Thereafter, a gate valve 17 is opened, and the mount 14 is moved onto an XY stage 19 within a vacuum chamber which has been evacuated in advance by means of a vacuum pump 18. It should be noted that the reference numeral 20 denotes a valve which is normally opened. After the gate valve 17 is closed, the inside of the vacuum chamber is sufficiently evacuated. Then, an ion beam 10 is drawn from a high-brightness ion source 22 such as a liquid metal ion source, e.g., gallium (Ga), which is provided within an ion beam lens tube 21 disposed at the upper side of the vacuum chamber by means of an extractor electrode 23 which is installed below the ion source 22, and the drawn ion beam 10 is then focused and deflected through electrostatic lenses 24, a blanking electrode 25, a deflector electrode 26, etc. so as to irradiate the semiconductor wafer 1. Then, secondary electrons which are generated by the irradiation with the ion beam 10 are detected by a secondary electron detector D to form a scanning ion beam image on a monitor 28 of a power supply 27 for the deflector electrode 26 on the basis of the secondary electron signal from the detector D. While observing the scanning ion beam image on the monitor 28, the operator moves the XY stage 19 to detect portions of the surface of the semiconductor wafer 1 where contact holes 7a and 7b are to be formed. Then, the detected surface portions of the wafer 1 alone are irradiated with the ion beam 10 to thereby form contact holes 7a and 7b, as shown in FIG. 3. Thereafter, the semiconductor wafer 1 is once taken out of the ion beam machining apparatus.

Figure 4:
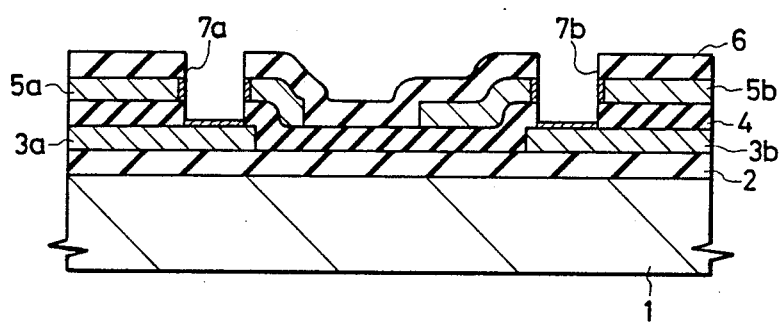

Next, the semiconductor wafer 1 is transferred to, for example, an anodizing apparatus (not shown) to anodize the surfaces of the second-level wirings 5a and 5b which are exposed through the contact holes 7a and 7b formed as described above, thereby forming insulating films 9, e.g., alumina ($Al_2O_3$) films, in self-alignment with the contact holes 7a and 7b as shown in FIG. 4. When aluminum (Al) is employed as a wiring material, the anodizing process may be carried out using as a cathode platinum (Pt) and as an electrolyte a 5%-oxalic acid, phosphoric acid, chromic acid or sulfuric acid solution. It should be noted that, as the result of the anodizing process, insulating films 9 are also formed on the surfaces of the first-level wirings 3a and 3b within the contact holes 7a and 7b. Thus, the surfaces of the second-level wirings 5a and 5b which are exposed through the contact holes 7a and 7b are changed into an insulator and it is therefore possible to prevent shorting between the first-level wirings 3a, 3b and the second-level wirings 5a, 5b by a simple process without the need for a complicated process such as a photolithographic process. It should be noted that the above-described alumina film may also be formed by, for example, $O_2$ plasma oxidation, in addition to anodizing. $O_2$ plasma oxidation technique is described, for example, in "Vacuum", Vol. 27, No. 12 (1984), p.901. When materials other than aluminum (Al), for example, refractory metals such as tungsten (W), molybdenum (Mo) or the like, are employed as a wiring material, oxides of these metals can be formed, for example, by subjecting the metals to a low-temperature heat treatment while irradiating them with ozone, and thus defining the insulating films 9. It should be noted that, as the result of irradiation of the surfaces of the first-level wirings 3a and 3b with the ion beam when the contact holes 7a and 7b are formed, a wiring material, e.g., aluminum, is deposited on the inner peripheral surfaces of the contact holes 7a and 7b as shown by the one-dot chain line in FIG. 3 and this may result in shorting between the first-level wirings 3a, 3b and the second-level wirings 5a, 5b when the contact holes 7a and 7b are formed. However, this problem can be eliminated by completely changing the aluminum deposited on the inner peripheral surfaces of the contact holes 7a and 7b into alumina by, for example, the above-described anodizing.

Figure 5:
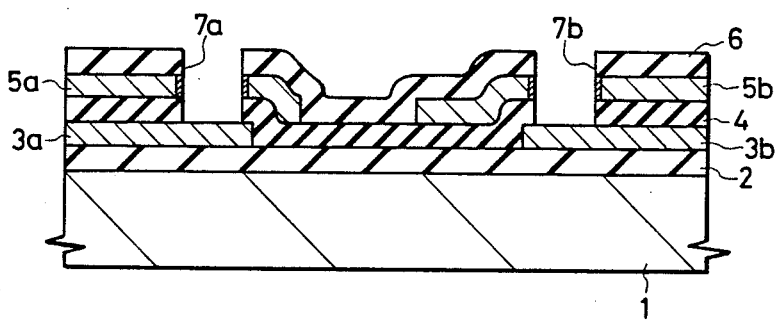

Next, the insulating films 9 which are formed on the surfaces of the first-level wirings 3a and 3b in the contact holes 7a and 7b as the result of the above-described anodizing are selectively removed by, for example, irradiation with a laser beam, thereby partially exposing the surfaces of the first-level wirings 3a and 3b, as shown in FIG. 5.

Then, the semiconductor wafer 1 is replaced on the mount 14 provided on the XY stage 13 shown in FIG. 6 and the mount 14 is moved onto an XY stage 30 within a vacuum chamber 29 of the laser CVD apparatus. The semiconductor wafer 1 is then moved by the operation of the XY stage 30 to a position where the wafer 1 is to be irradiated with a laser beam 32 oscillated from a laser oscillator 31, for example, an argon laser, thereby positioning the defective part of the wirings which is to be repaired. Then, the laser beam 32 is passed through a shutter 33, reflected by a dichroic mirror 34 and focused by an objective lens 35 so as to irradiate said part of the wirings through a window 36 which is provided in the wall of the vacuum chamber 29. At this time, it is possible to effect alignment of the defective part with the laser irradiation position while observing said part through an illumination optical system 37, a half-mirror 38, a laser beam cut filter 39, a prism 40 and an ocular 41. Then, a valve 42 is opened to introduce a reaction gas consisting of an organic metal compound, e.g., $Mo(CO)_6$ or $W(CO)_6$, into the vacuum chamber 29 from a gas cylinder 43 which is connected to the chamber 29. At the same time, a valve 44 is opened to introduce an inert gas into the vacuum chamber 29 from a gas cylinder 45. In this state, the laser beam 29 is selectively applied to the defective part of the wirings, thereby decomposing the reaction gas and selectively depositing a metal on the part irradiated with the laser beam 32. Thus, the connecting wiring 8 which interconnects the wirings 3a and 3b in the first-level layer through the contact holes 7a and 7b is formed as shown in FIGS. 1 and 2. In this case, it is possible to deposit a metal film having a thickness of, for example, about 0.5 to 1.0 μm by one scanning operation with the laser beam 32.

Although the present invention has been specifically described by way of one embodiment, it should be noted here that the present invention is not necessarily limited to the described embodiment and various changes and modifications may, of course, be imparted thereto without departing from the gist of the invention.

For example, although in the foregoing embodiment the defective part is repaired when the LSI is in the form of the semiconductor wafer 1, it is, of course, possible to repair the defective part after the semiconductor wafer 1 has been divided into individual semiconductor chips. Although in the foregoing embodiment repair of a defective part of the wirings or change of the logical design is effected after the completion of the LSI, it is also possible to apply the present invention to formation of wirings for realizing a desired logic in, for example, a master slice or a gate array. Further, the present invention may be applied to formation of a connecting wiring which interconnects wiring in the same layer or different layers in the course of the process for producing, for example, an LSI having a multi-layer wiring structure. The present invention may also be applied to, for example, a printed board having a multilayer wiring structure.

Figure 7:
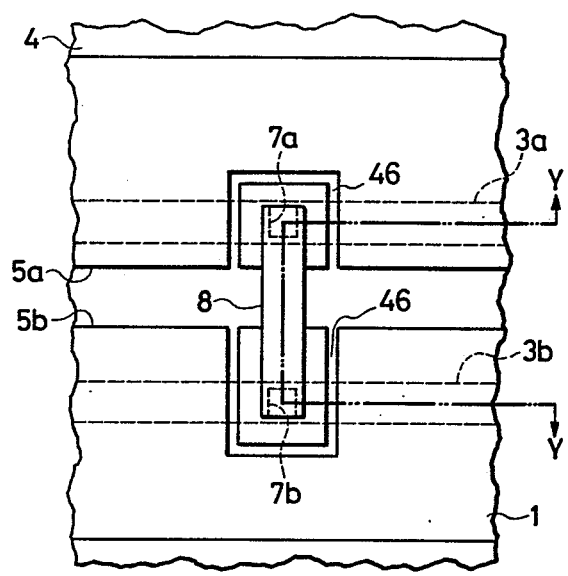
FIG. 7 is a plan view of an LSI, which shows another example of the structure for preventing shorting between wirings respectively located in the first- and second-level layers.
Figure 8:
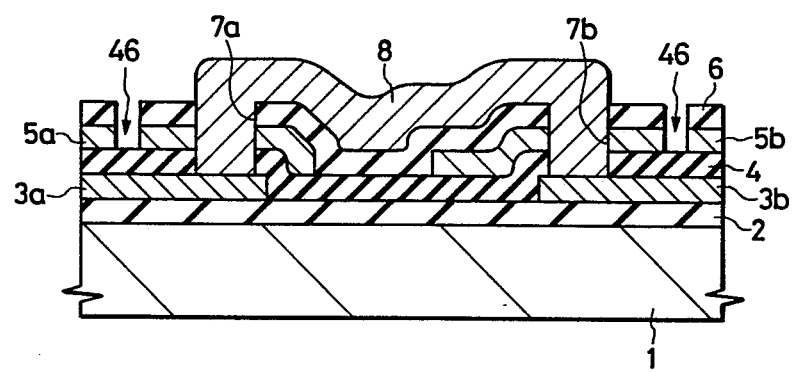
FIG. 8 is an enlarged sectional view taken along the line Y—Y of FIG. 7.

It should be noted that it is also possible to prevent contact between the connecting wiring 8 and the upper-level wirings 5a, 5b by means, for example, of grooves 46 which are formed by selectively removing the upper-level wirings 5a and 5b around the contact holes 7a and 7b, together with the insulating film 6 provided thereon, by means, for example, of irradiation with an ion beam, as shown in FIGS. 7 and 8. In this way, it is also possible to prevent shorting between the wirings 3a, 3b and the wirings 5a, 5b.

Embodiment 2

Figure 9:
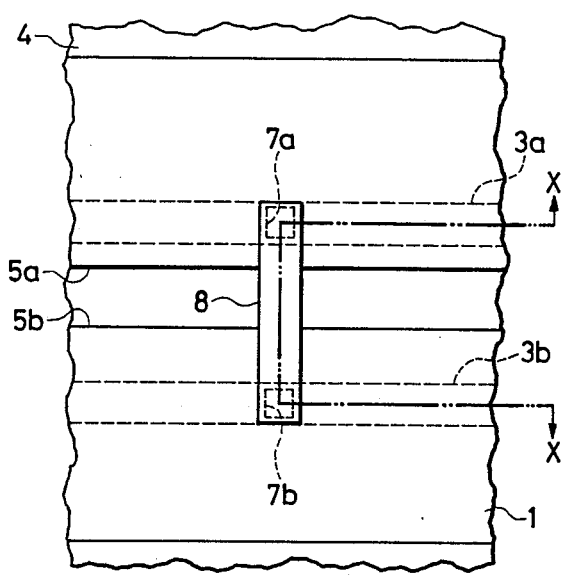
FIG. 9 is a plan view of an LSI in accordance with another embodiment of the present invention.
Figure 10:
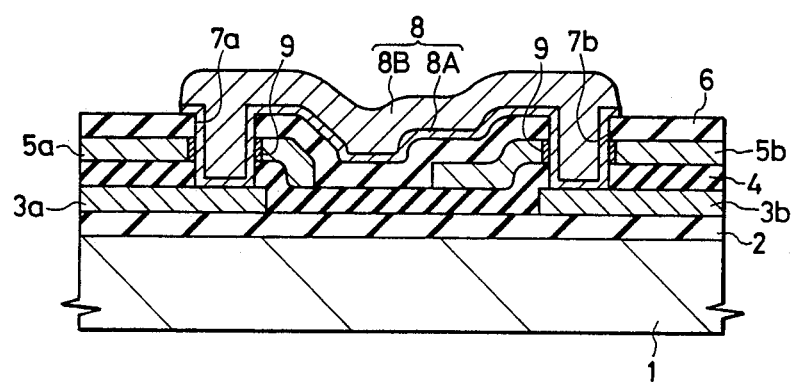
FIG. 10 is an enlarged sectional view taken along the line X—X of FIG. 9.

FIG. 9 is a plan view of an LSI having a double-layer wiring structure in accordance with another embodiment of the present invention, and FIG. 10 is an enlarged sectional view taken along the line X—X of FIG. 9.

As shown in FIGS. 9 and 10, the LSI in accordance with this embodiment has a semiconductor substrate (wafer) 1, for example, a silicon substrate, having a plurality of semiconductor elements such as transistors (not shown) fabricated thereon so as to form a semiconductor integrated circuit. An intermediate insulating film 2, for example, an $SiO_2$ film, is formed on the surface of the semiconductor substrate 1, and first-level wirings (i.e., lower-level wirings) 3a and 3b which are defined by, for example, an aluminum (Al) film, are provided on the intermediate insulating film 2. Another intermediate insulating film 4 which is defined by, for example, an $SiO_2$ film, is provided on the wirings 3a and 3b, and second-level wirings (i.e., upper-level wirings) 5a and 5b which are defined by, for example, an aluminum (Al) film, are provided on the intermediate insulating film 4. The wirings 5a and 5b define, for example, power supply wirings for supplying a power supply current, and are widely laid out over the surface of the intermediate insulating film 4. An insulating film 6 (not shown in FIG. 9) is further provided on the wirings 5a and 5b. Contact holes 7a and 7b are provided in such a manner as to extend through the insulating film 6, the wirings 5a, 5b (respectively) and the intermediate insulating film 4, and a connecting wiring 8 which interconnects the lower-level wirings 3a and 3b is provided in such a manner as to extend through these contact holes 7a and 7b. By using this connecting wiring 8, for example, a defect which is found after the completion of the LSI is repaired (or a logical design is changed). It should be noted that the contact holes 7a and 7b may be either vertical or tapered contact holes.

The connecting wiring 8 consists of a buffer film 8A such as a chromium (Cr) film and a metal film 8B such as a tungsten film. The metal film 8B is defined by a single-layer film consisting of tungsten (W), molybdenum (Mo), cadmium (Cd) or aluminum (Al), or a multi-layer film consisting of these metals, the single- or multi-layer film being selectively formed by means, for example, of laser CVD.

On the other hand, the buffer film 8A which is the other constituent element of the connecting wiring 8 is formed specifically from a metal such as chromium (Cr), molybdenum (Mo), tungsten (W) or nickel (Ni), or a semiconductor, such as Si, Ge, GaAs or polysilicon, which contains an active impurity, or a silicide which is an alloy of a metal and silicon. These substances have excellent adhesion to a $SiO_2$ passivation film covering the surface of a semiconductor device and a wiring material which is deposited by laser CVD.

Accordingly, there is no fear of the wiring material separating from the surface of the semiconductor device nor risk of the deposited wiring material being cracked.

Since the buffer film 8A has a high rate of absorption of a laser beam which causes the CVD phenomenon, it is possible to deposit a wiring material without the need to increase the laser output, and it is therefore possible to effect CVD with excellent controllability. In other words, it is possible to provide a wiring even if scanning with the laser beam is effected at high speed.

Further, since the presence of the buffer film 8A makes it possible to lessen the effects of the material and structure of the ground on which a wiring material is to be provided, it is easy to maintain the width and thickness of the wiring deposited on the buffer film 8A at constant levels. At the same time, the buffer film 8A absorbs the greater part of the energy of the laser beam and reflects part of the laser beam, and it is therefore possible to reduce the thermal effect of the wiring on the ground. It has been experimentally confirmed that, as the buffer film 8A, chromium (Cr) film is particularly preferable and practical.

It should be noted that the function and effects of the buffer film 8A and a process for producing the same are described in detail in the specification of Japanese Patent Application No. 245215/1986 filed on Oct. 17, 1986 by the same applicant.

The surfaces of the second-level wirings 5a and 5b which are exposed through the respective contact holes 7a and 7b are provided with respective insulating films 9, for example, alumina ($Al_2O_3$) films, which are formed by changing the surfaces into an insulator, thereby preventing contact between the connecting wiring 8 and the second-level wirings 5a, 5b. Accordingly, it is possible to form the connecting wiring 8 without any fear of the first-level wirings 3a, 3b electrically conducting, or shorting, to the second-level wirings 5a, 5b. The thickness of the insulating films 9 is selected so as to be adequate to obtain a necessary dielectric breakdown strength in accordance with the potential difference between the first-level wirings 3a, 3b and the second-level wirings 5a, 5b. For example, if the insulating films 9 are made of alumina (dielectric strength: about 500 V/$\mu$m) and the above-described potential difference is 5 V, the thickness of the films 9 may be selected so as to fall in the range from 1000 to 5000Å.

The LSI in accordance with this embodiment can be produced by appropriating the process for producing a buffer film disclosed in Japanese Patent Application No. 245215/1986 to the process for producing an LSI in accordance with the foregoing first embodiment.

Although the present invention has been specifically described by way of one embodiment, it should be noted here that the present invention is not necessarily limited to the described embodiment and various changes and modifications may, of course, be imparted thereto without departing from the gist of the invention.

For example, although in the foregoing embodiment the defective part is repaired when the LSI is in the form of the semiconductor wafer 1, it is, of course, possible to repair the defective part after the semiconductor wafer 1 has been divided into individual semiconductor chips. Although in the foregoing embodiment repair of a defective part of the wirings or change of the logical design is effected after the completion of the LSI, it is also possible to apply the present invention to formation of wirings for realizing a desired logic in, for example, a master slice or a gate array. Further, the present invention may be applied to formation of a connecting wiring which interconnects wirings in the same layer or different layers in the course of the process for producing, for example, an LSI having a multilayer wiring structure. The present invention may also be applied to, for example, a printed board having a multilayer wiring structure.

It should be noted that it is also possible to prevent contact between the connecting wiring 8 and the upper-level wirings 5a, 5b by means, for example, of grooves 46 which are formed by selectively removing the upper-level wirings 5a and 5b around the contact holes 7a and 7b, together with the insulating film 6 provided thereon, by means, for example, of irradiation with an ion beam, as shown in FIGS. 9 and 10. In this way, it is also possible to prevent shorting between the wirings 3a, 3b and the wirings 5a, 5b.

Embodiment 3

Figure 11:
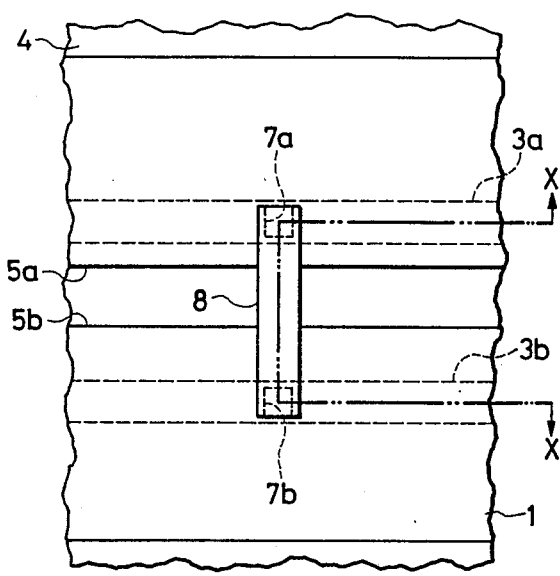
FIG. 11 is a plan view of an LSI in accordance with still another embodiment of the present invention.
Figure 12:
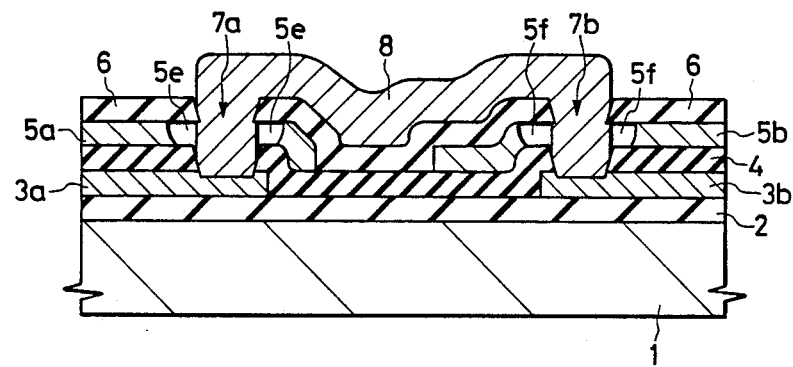
FIG. 12 is an enlarged sectional view taken along the line X—X of FIG. 11.

FIG. 11 is a plan view of an LSI having a double-layer wiring structure in accordance with still another embodiment of the present invention, and FIG. 12 is an enlarged sectional view taken along the line X—X of FIG. 11.

As shown in FIGS. 11 and 12, the LSI in accordance with this embodiment has a semiconductor substrate (wafer) 1, for example, a silicon substrate, having a plurality of semiconductor elements such as transistors (not shown) fabricated thereon so as to form a semiconductor integrated circuit. An intermediate insulating film 2, for example, an $SiO_2$ film, is formed on the surface of the semiconductor substrate 1, and first-level wirings (i.e., lower-level wirings) 3a and 3b which re defined by, for example, an aluminum (Al) film are provided on the intermediate insulating film 2. Another intermediate insulating film 4 which is defined by, for example, an $SiO_2$ film is provided on the wirings 3a and 3b, and second-level wirings (i.e., upper-level wirings) 5a and 5b which are defined by, for example, an aluminum (Al) film, are provided on the intermediate insulating film 4. The wirings 5a and 5b define, for example, power supply wirings for supplying a power supply current, and are widely laid out over the surface of the intermediate insulating film 4. An insulating film 6 (not shown in FIG. 11) is further provided on the wirings 5a and 5b. Contact holes 7a and 7b are provided in such a manner as to extend through the insulating film 6, the wirings 5a, 5b (respectively) and the intermediate insulating film 4, and a connecting wiring 8 which interconnects the lower-level wirings 3a and 3b is provided in such a manner as to extend through these contact holes 7a and 7b. By using this connecting wiring 8, for example, a defect which is found after the completion of the LSI is repaired (or a logical design is changed). It should be noted that the contact holes 7a and 7b may be either vertical or tapered contact holes. The connecting wiring 8 is defined by a metal film such as a tungsten (W), molybdenum (Mo), cadmium (Cd) or aluminum (Al) film which is selectively formed by, for example, laser CVD.

The second-level wirings 5a and 5b which are exposed through the respective contact holes 7a and 7b are provided with respective bores 5c and 5d which have a larger diameter than that of the contact holes 7a and 7b, as will be clear from FIG. 12, thereby preventing contact between the connecting wiring 8 and the second-level wirings 5a, 5b. Accordingly, it is possible to form the connecting wiring 8 without any fear of the first-level wirings 3a, 3b electrically conducting, or shorting, to the second-level wirings 5a, 5b.

The method of forming the bores 5c and 5d will be described later in detail.

The following is a description of a process for producing the LSI in accordance with this embodiment which is arranged as described above.

Figure 13:
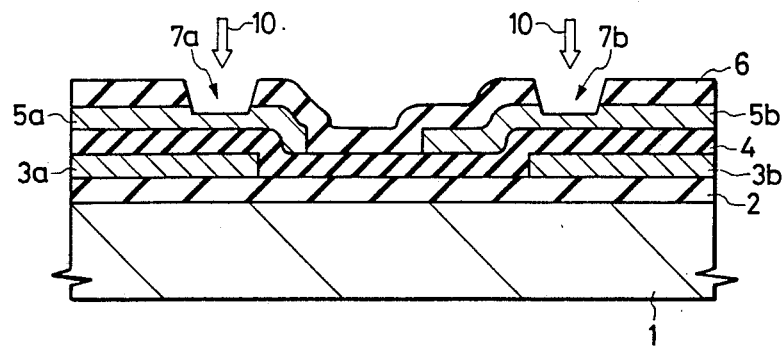
FIGS. 13 to 15 are sectional views showing successive steps in the process for producing the LSI shown in FIGS. 11 and 12.

Referring now to FIG. 13, a semiconductor integrated circuit is first formed on a silicon wafer 1 which serves as a starting material by carrying out diffusion of impurity ions, thermal oxidation of the silicon wafer 1, formation of thin films by CVD, formation of various patterns by the use of photolithographic techniques, etc. Then, an intermediate insulating film 2, first-level wirings 3a, 3b, an intermediate insulating film 4, second-level wirings 5a, 5b and an insulating film 6 are formed to complete an LSI. When it is necessary to find a possible defective part of the wirings and repair it, contact holes 7a and 7b are formed by irradiating predetermined portions of the surface of the insulating film 6 with a focused ion beam 10 (see FIG. 13) having a high degree of machining accuracy by using, for example, an ion beam machining apparatus such as that shown in FIG. 6 which is proposed in the aforementioned Japanese Patent Application No. 70979/1986.

Since this ion beam machining method has already been explained in detail with reference to FIG. 6 in the description of the first embodiment, repetitive description thereof is omitted.

Figure 14:
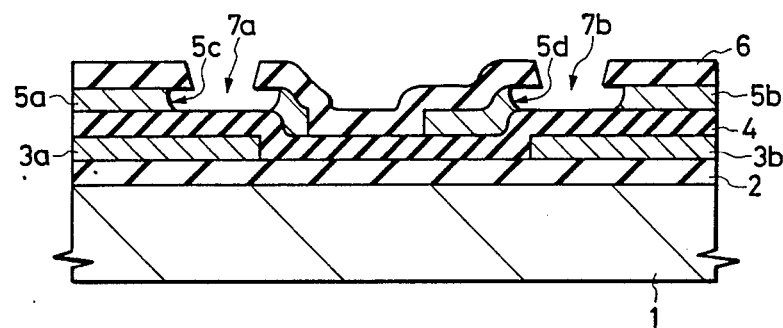

Next, as shown in FIG. 14, the second-level wirings 5a and 5b, e.g., aluminum (Al) film, the surfaces of which are exposed through the contact holes 7a and 7b are etched by wet etching using the insulating film 6 as an etching mask to thereby form bores 5c and 5d in the second-level wirings 5a and 5b, the bores 5c and 5d having a larger diameter than that of the contact holes 7a and 7b. In the formation of the bores 5c and 5d, it is preferable to set the diameter A of the bores 5c and 5d at a value which is, for example, about 4 μm larger than the diameter B of the contact holes 7a and 7b so that the edge of each of the bores 5c and 5d provided in the second-level wirings 5a and 5b is located at a position about 2 μm recessed from the edge of the corresponding one of the contact holes 7a and 7b. The above-described configuration of the bores 5c and 5d prevents the connecting wiring 8 (described later) from being electrically connected, or shorted, to the second-level wirings 5a, 5b.

In short, the dimensions of the bores 5c and 5d provided in the second-level wirings 5a and 5b may be so selected that the connecting wiring 8 which is connected to the first-level wirings 3a and 3b through the contact holes 7a and 7b is prevented from electrically connected to the second-level wirings 5a and 5b by the presence of the bores 5c and 5d.

As described above, the second-level wirings 5a and 5b are formed using, for example, aluminum or a material containing aluminum as its principal component, e.g., aluminum containing about 0.5 to 1.0% of silicon (Si). As a wet etching solution which may be employed to etch such a material containing aluminum as its principal component, it is preferable to use a mixed solution obtained by mixing together phosphoric acid, glacial acetic acid, nitric acid and water in the volume ratios 76:15:3:5. This etching solution is capable of etching not only aluminum but also alumina ($Al_2O_3$) which is an oxide of aluminum. Accordingly, it is possible to reliably remove only a desired portion even in the case of a wiring film which is made of a material containing aluminum as its principal component and which has a thin alumina film formed on its surface by oxidation of the surface of an aluminum film. It should be noted that various wet etching solutions other than that described above may also be employed to etch a wiring material containing aluminum as its principal component.

Figure 15:
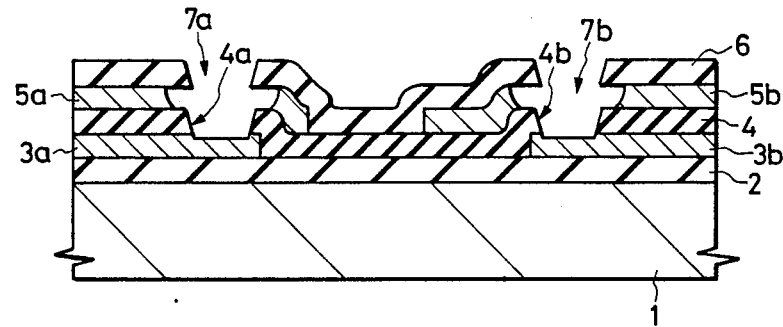

Subsequently, as shown in FIG. 15, the regions of the intermediate insulating film 4 the surfaces of which are exposed through the contact holes 7a and 7b are irradiated with a focused ion beam of high degree of machining accuracy by the use of an ion beam machining apparatus to thereby form bores 4a and 4b. At this time, by virtue of the rectilinear propagation nature of the focused ion beam, bores 4a and 4b which have substantially the same diameter as that of the contact holes 7a and 7b are formed thereunder.

Next, a metal film such as tungsten (W) or molybdenum (Mo) is formed in a predetermined pattern by scanning it with a laser beam by laser CVD which is an optically pumped CVD method, as shown in FIGS. 11 and 12.

It should be noted that the reference numerals 5e and 5f in FIG. 12 denote air gap regions. The connecting wiring 8 and the second-level wirings 5a, 5b are electrically isolated from each other by the air gap regions 5e and 5f.

In this embodiment, electrical isolation of the connecting wiring 8 from the second-level wirings 5a, 5b is effected by the air gap regions 5e and 5f which are formed by partially removing the second-level wirings 5a and 5b by wet etching. Thus, this embodiment, which employs wet etching, has the merit that it is possible to provide an electrical isolation means in a simple operation and within a short period of time in comparison with the method described in the first embodiment. Since the isolation method by anodizing which has been described in the first embodiment is carried out by dipping the sample in an electrolytic bath containing an electrolyte, the electrolyte and various contaminants adhere to the sample, and a complicated process is needed to completely clean the attached electrolyte and contaminants. With an ordinary cleaning operation, it is impossible to completely remove the attached electrolyte and various contaminants, and they are unavoidably left on the sample. These residual substances may lead to lowering in reliability of LSI characteristics and deterioration in electrical characteristics of the device after it has been put to actual use. Further, when selective regions of the aluminum wiring is changed into alumina by anodizing, other regions of the sample may be undesirably anodized, and this may lead to deterioration in electrical characteristics of a sample, e.g., an LSI, generation of a failure and lowering in the reliability. There is one type of LSI for computers which has a large number of bump electrodes made of a solder material as external lead terminals and which is mounted on a circuit board through the bump electrodes by CCD (Controlled Collapse Bonding) method, and some of these LSIs have several hundreds of bump electrodes on the plane of an LSI chip of, for example, 10 mm × 10 mm. In the case of a sample which has such bump electrodes, when the aluminum wiring is anodized, the bump electrodes may also be undesirably anodized, which gives rise to problems such as lowering in the electrical characteristics and occurrence of a failure.

In contrast to this, the isolation method by wet etching described in this embodiment enables the etching solution attached to the sample to be completely cleaned (removed) in a simple operation and within a short period of time and this isolation method is free from various problems which are experienced with the anodizing process. Therefore, it should be borne in mind that the isolation method in accordance with this embodiment is more practical than the anodizing method and is a superior method which does not lead to deterioration in electrical characteristics nor lowering in reliability of the sample.

As the connecting wiring 8 in this embodiment, it is possible to employ the composite film of the buffer film 8A and the metal film 8B which has been described in the second embodiment.

Although the present invention has been specifically described by way of one embodiment, it should be noted here that the present invention is not necessarily limited to the described embodiment and various changes and modifications may, of course, be imparted thereto without departing from the gist of the invention.

For example, although in the foregoing embodiment the defective part is repaired when the LSI is in the form of the semiconductor wafer 1, it is, of course, possible to repair the defective part after the semiconductor wafer 1 has been divided into individual semiconductor chips. Although in the foregoing embodiment repair of a defective part of the wirings or change of the logical design is effected after the completion of the LSI, it is also possible to apply the present invention to formation of wirings for realizing a desired logic in, for example, a master slice or a gate array. Further, the present invention may be applied to formation of a connecting wiring which interconnects wirings in the same layer or different layers in the course of the process for producing, for example, an LSI having a multilayer wiring structure. The present invention may also be applied to, for example, a printed board having a multilayer wiring structure.

Embodiment 4

Giving an outline of this embodiment, a hole is bored by means of a focused ion beam in that portion of an insulating film which is located above that portion of a wiring which is desired to be connected to another portion, and said portion of the wiring is irradiated with a focused laser or ion beam in a metal compound gas to deposit a metal in the above-described hole, thereby forming a wiring. In this case, the hole is machined so that the upper portion of the hole is widened, and the metal is buried in the hole in such a manner that a particularly large amount of metal is deposited in the upper portion of the hole, thereby enabling the deposited metal to be satisfactorily connected to the wiring at the lower side of the hole.

By virtue of this arrangement, the positions of a plurality of wirings which are to be interconnected are detected by employing a scanning ion microscope using a secondary electron or ion signal obtained from the sample, thereby positioning the sample and determining portions to be irradiated with an ion beam. Thereafter, said portions of the sample are irradiated with the ion beam to remove those portions of the insulating film which are located above said portions of the wirings. Since in this case a focused ion beam is employed instead of a laser beam, it is possible to effect machining on the order of 0.5 $\mu m$ or less with the focused ion beam. Further, since the ion beam enables any kind of material to be uniformly machined, it is possible to machine a stack of insulating films such as $SiO_2$ and $Si_3N_4$ successively from the upper side thereof and thereby bore a hole therein to expose the surface of the wiring in the lower layer. Thereafter, a metal compound gas is introduced into the vacuum chamber through a nozzle or a pipe, and the sample table is moved relative to the vacuum chamber so that portion of the sample where a connecting wiring is to be formed is irradiated with a focused ion or laser beam. Then, a metal wiring is formed by ion beam induced CVD process or laser DVD process. As a result, it is possible to interconnect wirings inside an IC after the completion thereof, so that it is possible to debug and repair the IC and effect a defect analysis. It should be noted that debugging of ICs herein includes finding and correcting an error in connection of the wirings in ICs and making a diagnosis of ICs.

The feature of this embodiment also resides in a method of notching that portion of the upper-level wiring which is in contact with the buried metal in order to prevent the metal which is buried to provide connection with the lower-level wiring from electrically conducting to the upper-level wiring.

Figure 16:
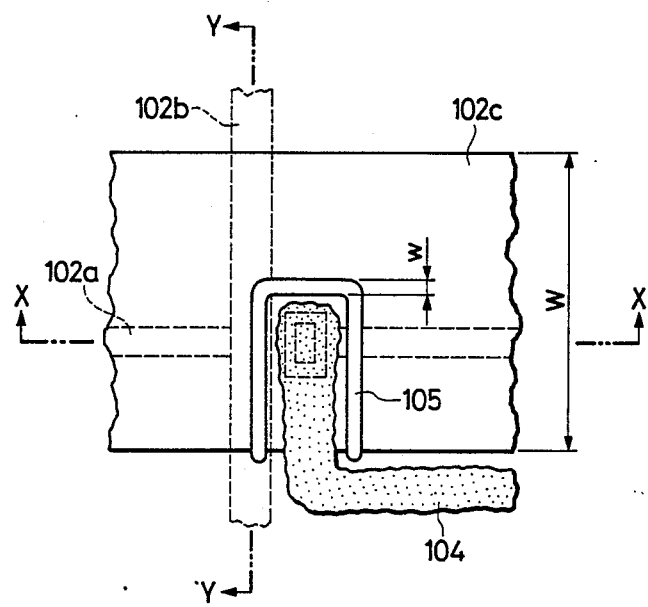
FIGS. 16 and 17 show a method of interconnecting wirings in an IC in accordance with one embodiment of the present invention, FIG. 16 being a fragmentary plan view of the IC, and FIG. 17 being a sectional view taken along the line X—X of FIG. 16.
Figure 17:
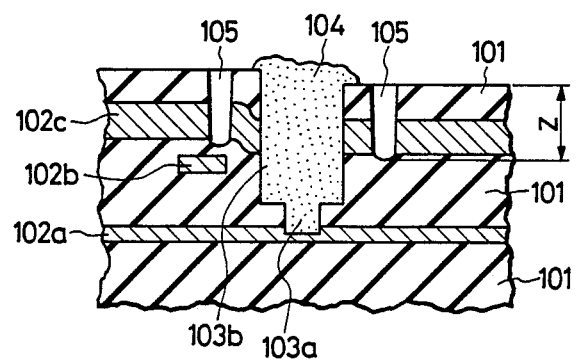

FIGS. 16 and 17 show in combination a method of forming a connecting wiring on an IC in accordance with one embodiment of the present invention.

Referring to FIG. 17, which is a sectional view of an IC chip, an insulating film (e.g., a $SiO_2$ film) 101 is provided on a substrate (e.g., a Si substrate), and wirings (e.g., Al wirings) 102a, 102b and 102c are formed on the insulating film 101 with an insulating film 101 interposed between each pair of adjacent wirings. Further, a protective film (e.g., a $SiO_2$ or $Si_3N_4$ film) 101 is formed on the uppermost wiring 102c.

When it is desired to electrically connect the lower-level wiring 102a to another wiring (not shown), holes 103a and 103b are bored in the insulating films 101 above the wiring 102a by means of a focused ion beam to thereby expose a part of the wiring 102a. Thereafter, a metal wiring 104 is buried in the holes 103a and 103b by laser induced CVD or other similar means and the metal wiring 104 is then formed so as to extend to a desired node or point of connection.

Prior to the formation of the metal wiring 104, it is also possible to form a structure in which a buffer film is provided under the metal wiring 104 as described in the second embodiment.

Since the IC has a multilayer wiring structure, if a connecting wiring is to be led from the first-level (lowermost) wiring 102a, the connecting wiring must be prevented from coming into contact with the upper-level wirings. In the arrangement shown in FIG. 16, a hole is bored at a position which is spaced apart from the second-level wiring 102b. However, the third-level (uppermost) wiring 102c is usually used as a power supply wiring and therefore has a relatively wide width W as shown in FIG. 16. Accordingly, it is difficult to bore a hole for burying a connecting wiring at a position which is off the third-level wiring 102c. For this reason, in most cases the hole 103b is inevitably provided so as to extend through the third-level wiring 102c; in such cases, if the metal wiring 104 is formed in this hole by laser CVD or other similar means, the first- and third-level wirings 102a and 102c undesirably short to each other. In order to avoid this problem, a notch 105 (having a width W) shown in FIG. 16 is cut outside the hole 103b so that the depth Z of the notch 105 is slightly greater than the depth of the third-level wiring 102c, thereby electrically isolating that portion of the third-level wiring 102c which is in contact with the metal wiring 104 from the other portion of the wiring 102c. Thereafter, a metal wiring is formed by laser CVD or other similar means so as to extend through the area defined between the two ends of the notch 105 having a U-shaped planar configuration.

Figure 18:
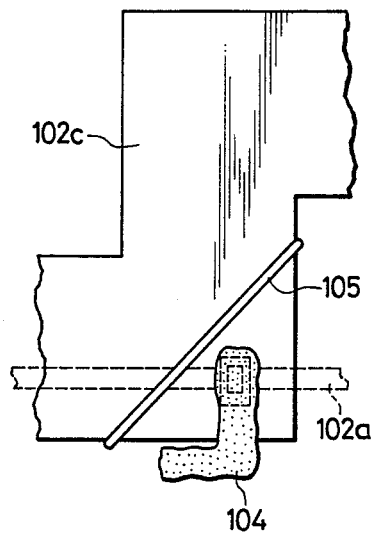
FIGS. 18 and 19 show other embodiments, respectively, of the present invention.

If the third-level wiring 102c is curved as shown in FIG. 18, the wiring 102c may be notched diagonally. By doing so, it is advantageously possible to simplify the scanning with the ion beam.

Figure 19:
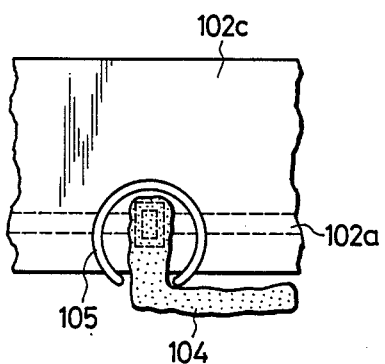

The notch 105 may be circular as shown in FIG. 19. In this case, it is possible to readily carry out scanning with the ion beam by superposing sine waves in the X- and Y-directions one upon the other.

In the case where the second-level wiring 102b is present below the notch 105 as shown in FIG. 16, care must be taken of the following point. In such a case, the second-level wirings are often arranged at a pitch of, for example, 5 to 10 μm, because the integration density of ICs is increasing these days. Therefore, if the holes 103a and 103b are positioned so as to be spaced apart from the second-level wiring 102b, there is a good possibility that the notch 105 will overlap the wiring 102b. In such a case, it is important to appropriately control the depth of the notch 105.

Figure 21:
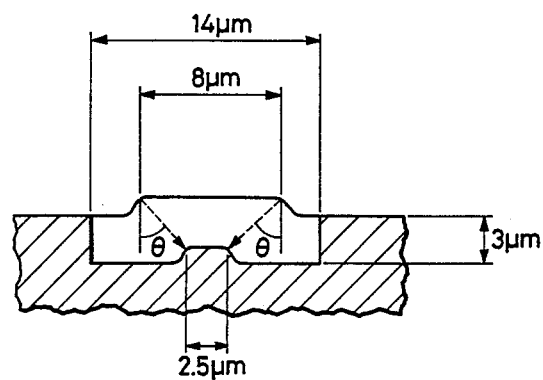
FIG. 21 is a sectional view taken along the line X—X of FIG. 20.
Figure 22:
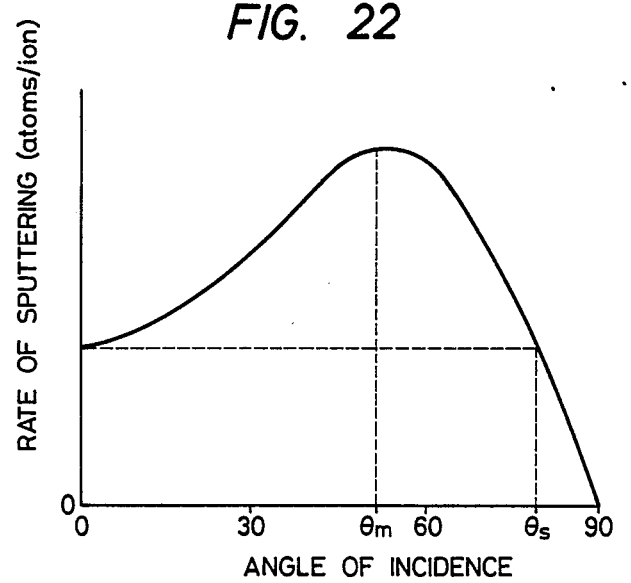
FIG. 22 is a graph showing the experimental results shown in FIG. 20.

It is clear from the experimental results (see FIGS. 20 and 21) that, if the surface of a workpiece which has a convex step is subjected to sputter etching by means of a focused ion beam, etching progresses toward the convex side of the step configuration. This is because, as is well known, when the angle of incidence of the beam on the surface to be etched is near 40° to 70°, the rate of sputtering is 1.5 to 2 times that in the case where the angle of incidence is 0° (see FIG. 22). It will be understood from FIG. 21 that in this experiment the step progress with the angle $\theta$ being about 45°.

FIG. 23 is a sectional view taken along the line Y—Y of FIG. 16. Since the step of the third-level wiring 102c causes the protective film 101 to have a step 106, the configuration of the step 106 is reflected on the bottom surface of the notch 105 as will be clear from the above-described experimental results, so that the second-level wiring 102b is partially etched. As a result, as shown in FIG. 24 which is a sectional view taken along the line Z—Z of FIG. 23, the cross-sectional area of the second-level wiring 102b is reduced, which results in the reliability of the device being deteriorated, or when the second-level wiring 102b is subjected to sputter etching, the wiring material adheres to the side walls of the notch 105 as shown by the reference numeral 107 and the wiring material 107 attached to the side walls may short the second- and third-level wirings.

Figure 20:
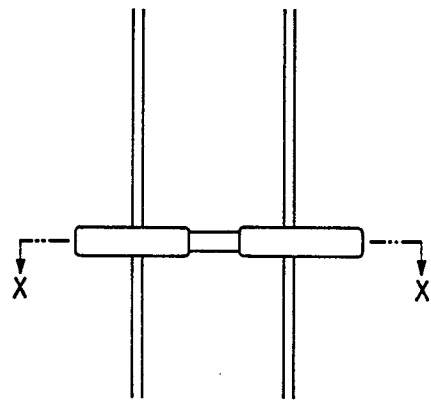
FIG. 20 shows experimental results of a machining process for forming a notch.
Figure 25:
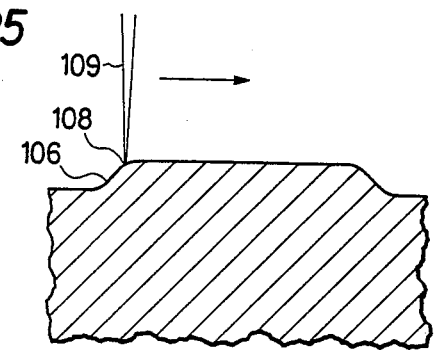
FIGS. 25 to 27 show in combination an example of a machining method which enables elimination of a step from the machined surface.
Figure 26:
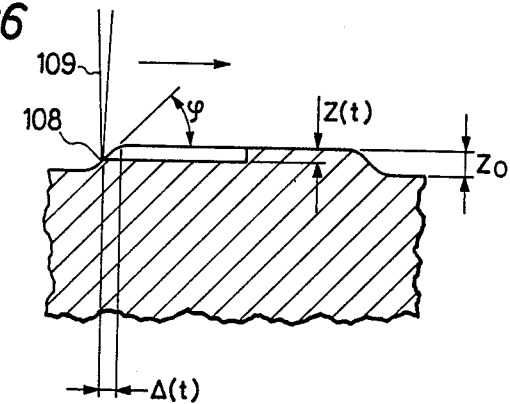
Figure 27:
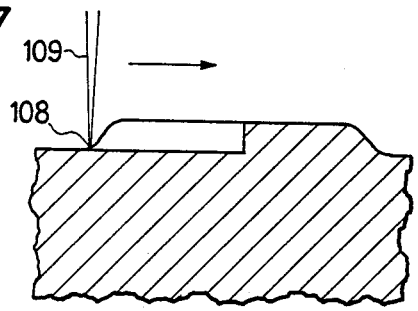

To cope with the above-described problems, the edge portion 108 of the step 106 is detected with a secondary particle image as shown in FIG. 20, and scanning with a focused ion beam 109 is started from the edge portion 108 as shown in FIG. 25. Since the depth $Z(t)$ of machining shown in FIG. 26 is proportional to the machining time t in the case where the ion current is adequately stable (within ±5% in the case of ordinary apparatus), the depth $Z(t)$ is determined as a function of the time t. The angle $\rho$ of inclination of the step 6 is constant for the devices produced by the same film forming process and therefore can be known in advance. Accordingly, it is possible to start machining from the edge portion 108 shown in FIG. 26 at all times by shifting the starting position of scanning with the focused ion beam 109 leftward by $\Delta(t) = Z(t)/\tan\rho$ on the basis of $Z(t)$ and $\rho$. The function is not necessarily fixed to the above-described one. If the above-described scanning start position is shifted until the height of the step is $Z_0 - Z(t)$, the bottom surface of the notch 105 is flush with the surface of the element. By carrying out an ordinary machining operation thereafter, it is possible to complete a notch 105 having a flat bottom surface as shown in FIG. 28. Thus, it is possible to increase the yield at which the shorting of the third-level wiring is prevented by means of the notch.

As described above, after the boring of a contact hole in the sample and the machining to provide a short preventing notch, the metal wiring 104 is formed so as to extend between desired points of connection by laser or ion beam induced CVD, thereby interconnecting the lower-level wiring 102b and another wiring.

As has been described above, the present invention makes it possible to interconnect as desired wirings which are located at different positions in an IC which has a high integration density and a multilayer wiring structure, so that it is possible to readily carry out a defect analysis in any stage of fabrication of LSIs, i.e., designing, trial production and mass production of LSIs. Thus, it is advantageously possible to shorten the development step, reduce the period of time required to start mass production of LSIs, and increase the production yield.

What is claimed is:

1. A process for producing a semiconductor integrated circuit device having a multilayer wiring structure in which a first insulating film is interposed between an upper-level wiring and a lower-level wiring and the surface of said upper-level wiring is protected by a second insulating film, said method comprising the steps of:

preparing a semiconductor substrate having an integrated circuit formed thereon, said integrated circuit including a semiconductor element having a PN junction, said substrate further having a multilayer wiring structure formed on its surface, said wiring structure being electrically connected to said integrated circuit;

selectively removing successively the second insulating film, the upper-level wiring under said insulating film and the first insulating film under said upper-level wiring in said multilayer wiring structure by machining with a focused ion beam to form a contact hole through which a surface of said lower-level wiring is exposed, said contact hole exposing a surface of the upper-level wiring;

changing a region of said upper-level wiring whose surface is exposed through said contact hole into an insulator; and forming a connecting wiring by an optically pumped CVD method so as to extend over from the inside of said contact hole to a selective region on the surface of said second insulating film, said connecting wiring being electrically connected to said lower-level wiring the surface of which is exposed through said contact hole.

2. A process for producing a semiconductor integrated circuit device according to claim 1, wherein said upper-level wiring is made of a material which contains aluminum as its principal component, said region of said upper-level wiring whose surface is exposed through said contact hole being changed into an insulator by oxidizing said material containing aluminum as its principal component to form alumina.

3. A process for producing a semiconductor integrated circuit device according to claim 1, wherein said optically pumped CVD method is a CVD method that utilizes a laser beam, said connecting wiring being made of one material selected from the group consisting of tungsten (W), molybdenum (Mo), cadmium (Cd) and aluminum (Al).

4. A process for producing a semiconductor integrated circuit device according to claim 1, wherein said connecting wiring is provided with a buffer film as its underlaying conductor which is made of one material selected from the group consisting of chromium (Cr), molybdenum (Mo), tungsten (W) and nickel (Ni).

5. A process for producing a semiconductor integrated circuit device according to claim 1, wherein said substrate is in the form of either a semiconductor wafer which has a plurality of semiconductor integrated circuits formed thereon both lengthwise and crosswise or a semiconductor integrated circuit chip which is formed by dividing said semiconductor wafer into individual semiconductor integrated circuit chips (pellets).

6. A process for producing a semiconductor integrated circuit device having a multilayer wiring structure in which a first insulating film is interposed between an upper-level wiring and a lower-level wiring and the surface of said upper-level wiring is protected by a second insulating film, said method comprising the steps of:
    preparing a semiconductor substrate having an integrated circuit formed thereof, said integrated circuit including a semiconductor element having a PN junction, said substrate further having a multilayer wiring structure formed on its surface, said wiring structure being electrically connected to said integrated circuit;
    selectively removing successively the second insulating film in said multilayer wiring structure by machining with a focused ion beam to form a contact hole which exposes the surface of the upper-level wiring in this region;
    selectively removing the upper-level wiring the surface of which is exposed through said contact hole by a wet etching process using said second insulating film as an etching mask to form an opening region in said upper-level wiring, said opening region having a larger diameter than that of said contact hole;
    selectively removing said first insulating film the surface of which is exposed through said contact hole by machining with a focused ion beam to form an opening portion which exposes the surface of said lower-level wiring in this region; and
    forming a connecting wiring by an optically pumped CVD method so as to extend over from the inside of said contact hole to a selective region on the surface of said second insulating film, said connecting wiring being electrically connected to said lower-level wiring the surface of which is exposed through said contact hole.

7. A process for producing a semiconductor integrated circuit device according to claim 6, wherein said upper-level wiring is made of a material which contains aluminum at its principal component.

8. A process for producing a semiconductor integrated circuit device according to claim 6, wherein said optically pumped CVD method is a CVD method that utilizes a laser beam, said connecting wiring being made of one material selected from the group consisting of tungsten (W), molybdenum (Mo), cadmium (Cd) and aluminum (Al).

9. A process for producing a semiconductor integrated circuit device according to claim 6, wherein said connecting wiring is provided with a buffer film as its underlaying conductor which is made of one material selected from the group consisting of chromium (Cr), molybdenum (Mo), tungsten (W) and nickel (Ni).

10. A process for producing a semiconductor integrated circuit device according to claim 6, wherein said substrate is in the form of either a semiconductor wafer which has a plurality of semiconductor integrated circuits formed thereon both lengthwise and crosswise or a semiconductor integrated circuit chip which is formed by dividing said semiconductor wafer into individual semiconductor integrated circuit chips (pellets).

11. A process for producing a semiconductor integrated circuit device having a multilayer wiring structure in which a plurality of layers of wirings are isolated from each other by respective insulating films and a connecting wiring is connected to a lower-level wiring through a contact hole provided so as to extend through an upper-level wiring, said process comprising the steps of:
    forming said contact hole by irradiation with an ion beam, said contact hole exposing a surface of the upper-level wiring;
    changing a portion of said upper-level wiring whose surface is exposed through said contact hole into an insulator; and
    forming said connecting wiring by laser CVD.

12. A process for producing a semiconductor integrated circuit device according to claim 11, wherein said multilayer wiring structure is a double-layer wiring structure.

13. A process for producing a semiconductor integrated circuit device according to claim 11, wherein said wirings are aluminum wirings.

14. A process for producing a semiconductor integrated circuit device according to claim 11, wherein said insulator is alumina.

15. A process for producing a semiconductor integrated circuit device according to claim 14, wherein said alumina is formed by either anodizing or oxygen plasma oxidation.

16. A process for producing a semiconductor integrated circuit device according to claim 11, wherein said connecting wiring is defined by a molybdenum, tungsten, cadmium or aluminum film.

17. A process for producing a semiconductor integrated circuit device according to claim 11, wherein said connecting wiring is formed by laser CVD employing an organic metal compound.

18. A process for producing a semiconductor integrated circuit device wherein holes are bored in an upper-level insulating film at a portion thereof where contact holes are to be provided by machining with an energy beam and then the insides of these holes and the region therebetween are irradiated with a laser or focused ion beam in an atmosphere containing a metal compound gas to deposit a metal on the irradiated regions, thereby forming a metal film between wirings and thus electrically connecting together these wirings, wherein the improvement comprises notching a portion of the upper-level wiring at which the metal is deposited to form a notch, the notch being formed so as to extend completely through the upper-level wiring at a location around the contact holes, thereby electrically isolating said portion from another portion of the upper-level wiring.

19. A process for producing a semiconductor integrated circuit device according to claim 18, wherein said notching is carried out with an energy beam such as a focused ion beam in such a manner that scanning for machining is started from an edge portion of a step of a protective film provided on said upper-level wiring and the point of starting the scanning is shifted toward the lower side of the step as the depth of machining increases, the shift of the starting point being repeated until the bottom surface of the machined groove is coincident with the lower portion of said protective film.

20. A process for producing a semiconductor integrated circuit device according to claim 1, wherein said region of the upper-level wiring that is changed into an insulator includes the surface of the upper-level wiring that is exposed through the contact hole.

21. A process for producing a semiconductor integrated circuit device according to claim 11, wherein said portion of the upper-level wiring that is turned into the insulator includes the surface of the upper-level wiring that is exposed through the contact hole.

22. A process for producing a semiconductor integrated circuit device according to claim 11, wherein the upper-level wiring is made of a refractory material, and said changing is performed by a heat treatment while irradiating the exposed surface of the upper-level wiring with ozone.

23. A process for producing a semiconductor integrated circuit device according to claim 1, wherein said selectively removing is performed at two locations so as to form two contact holes through which surfaces of lower-level wirings are exposed at the two locations; and said forming a connecting wiring is performed so as to extend over from the inside of each contact hole to a selective region on the surface of said second insulating film.

24. A process for producing a semiconductor integrated circuit device according to claim 23, wherein said forming a connecting wiring is performed so as to electrically connect the lower-level wirings exposed at the two contact holes.

25. A process for producing a semiconductor integrated circuit device according to claim 24, wherein said lower-level wirings include first-level and second-level wirings, the first-level wiring and second-level wiring being formed of different layers of wiring, whereby a connecting wiring interconnecting different layers is provided.

26. A process for producing a semiconductor integrated circuit device according to claim 1, wherein said connecting wiring is provided with a buffer film as its underlying conductor, and wherein said buffer film is made of a semiconductor material containing an active impurity, or of a silicide.

27. A process for producing a semiconductor integrated circuit device according to claim 6, wherein said wet etching process is performed using, as the etchant, a solution of phosphoric acid, glacial acetic acid, nitric acid and water.

28. A process for producing a semiconductor integrated circuit device according to claim 18, wherein said energy beam is a focused ion beam.

29. A process for producing a semiconductor integrated circuit device according to claim 11, wherein two contact hole, at spaced locations, are provided to extend through the upper-level wiring, each contact hole exposing a surface of the upper-level wiring; and said changing, and said forming said connecting wiring, steps are performed for each of said contact holes.

30. A process for producing a semiconductor integrated circuit device according to claim 29, wherein the step of forming said connecting wiring is performed so as to electrically connect lower-level wirings through said two contact holes.

31. A process for producing a semiconductor integrated circuit device having a multilayer wiring structure in which a plurality of layers of wirings are isolated from each other by respective insulating films and a connecting wiring is connected to a lower-level wiring through a contact hole provided so as to extend through an upper-level wiring, said process comprising the steps of:
forming said contact hole by irradiation with a focused ion beam, so as to expose the lower-level wiring, the contact hole being formed so that upper portions of the hole are larger than lower portions; and
forming said connecting wiring by irradiating the contact hole with a focused laser beam or focused ion beam, in an atmosphere of a metal compound gas, to deposit a metal of said connecting wiring.

* * * * *